United States Patent
Kondo et al.

(10) Patent No.: US 7,596,036 B2
(45) Date of Patent: Sep. 29, 2009

(54) MEMORY CONTROL CIRCUIT, MICROCOMPUTER, AND DATA REWRITING METHOD

(75) Inventors: Takao Kondo, Kanagawa (JP); Youji Terauchi, Kanagawa (JP); Yuuji Kuge, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 126 days.

(21) Appl. No.: 11/808,063

(22) Filed: Jun. 6, 2007

(65) Prior Publication Data

US 2007/0297237 A1 Dec. 27, 2007

(30) Foreign Application Priority Data

Jun. 19, 2006 (JP) ............................. 2006-168941

(51) Int. Cl.
*G11C 7/06* (2006.01)

(52) U.S. Cl. ..................... 365/189.07; 365/185.23; 365/185.22

(58) Field of Classification Search ............ 365/185.22, 365/185.23, 185.03, 185.18, 185.08, 189.03, 365/189.07, 230.03

See application file for complete search history.

(56) References Cited

U.S. PATENT DOCUMENTS

| | | | | |
|---|---|---|---|---|
| 6,320,791 B1 * | 11/2001 | Mio | ....................... | 365/185.22 |
| 6,734,863 B1 * | 5/2004 | Ikeda | ......................... | 345/531 |
| 7,149,944 B2 * | 12/2006 | Okawa et al. | ............... | 714/738 |
| 2004/0107396 A1 * | 6/2004 | Barone et al. | ............... | 714/733 |
| 2004/0255205 A1 * | 12/2004 | Oodate et al. | .................. | 714/54 |
| 2005/0068816 A1 * | 3/2005 | Yoshimatsu et al. | ......... | 365/201 |

FOREIGN PATENT DOCUMENTS

JP 2003-256266 A 9/2003

* cited by examiner

*Primary Examiner*—Dang T Nguyen
(74) *Attorney, Agent, or Firm*—Foley & Lardner LLP

(57) ABSTRACT

A memory control circuit according to an embodiment of the present invention includes: a writable/readable memory; a comparison unit comparing write data to write in the memory with read data that is read from a memory address where the write data is written; a comparison result storage unit storing a comparison result compared by the comparison unit in association with the memory address; and a control unit controlling retry processing of rewriting the write data to the memory address determined to be unverified based on the stored comparison result.

20 Claims, 10 Drawing Sheets

MEMORY CONTROL CIRCUIT, MICROCOMPUTER, AND DATA REWRITING METHOD

BACKGROUND OF THE INVENTION

1. Field of the Invention

The present invention relates to a memory control circuit and a data rewriting method, which can reduce processing time for rewriting data stored in a storage element.

2. Description of Related Art

Hitherto, the following technique has been used for rewriting data stored in a memory or other such storage elements. FIG. 9 is a flowchart of a rewriting processing flow of the related art. Referring to FIG. 9, the related art is described below. According to the related art, if a CPU requests a memory control circuit to rewrite data, verification processing and retry processing (S800) are executed following write processing (S700).

To begin with, write data output from a CPU is written to a storage element in accordance with write processing in S700. Next, the data written to the storage element is compared with the original write data in S800 to determine whether or not the data is correctly written (verification processing). In the following description, data to write in the storage element is referred to as "write data". Data obtained by reading the data written to the storage element for verification processing is referred to as "read data". If the read data matches with the write data, and the data is correctly written, data rewriting processing is completed. If the read data does not match with the write data, and the data is not correctly written, processing of rewriting write data to mismatched data that has been written to the storage element (retry processing) is performed.

The processing of FIG. 9 is described below in more detail. FIG. 10 is a detailed flowchart of the write processing (S700) of FIG. 9. Referring to FIG. 10, operations in the write processing are described next. Although not shown, the memory control circuit of the related art includes a first memory storing write data output from the CPU and a second memory used for data transmission between the CPU and the first memory. First, if the CPU requests the memory control circuit to perform data rewriting processing, the memory control circuit is set to a write mode (S701). In S702, information about an address of the first memory to which the write data is written is acquired. As a unit processing amount of the write data, an area designated as a write target (hereinafter referred to as "designated area") may be all processed, or the designated area may be divided in predetermined units to process each divided area. Incidentally, in the first memory, one address corresponds to one writing operation. In S703, write data is stored in the second memory. In S704, the write data is stored at the address of the first memory acquired in S702 (write control processing). In S705, it is determined whether or not data has been written to all the designated area. If the data has been written, the write processing is terminated. If the data has not yet been written, information about an address to which the next write data is written is retrieved (S706), and the next write data is stored in the second memory (S707). Then, the step S704 and subsequent steps are repeated.

FIG. 11 is a detailed flowchart of the verification processing and retry processing (S800) of FIG. 9. Referring to FIG. 11, operations in the verification/retry processing of the related art are described next. First, a verification mode is set in S801 to verify whether or not the data is correctly written to the first memory in the write processing (S700). In S802, information about an address of the first memory storing data to verify is acquired. In S803, write data corresponding to the data stored at the address retrieved in S802 is stored in the second memory. Upon verification control processing in S804, the data stored at the address of the first memory retrieved in S802 is read (read data) and compared with write data stored in the second memory. It is determined whether or not the write data matches with the read data (S805). If matched, whether or not the data written to the designated area has been all verified is determined (S806). If not all verified, address information for the next data to verify is acquired (S807). Then, write data corresponding to the data is stored in the second memory (S808), and the step S804 and subsequent steps are repeated.

In S805, if the write data does not match with the read data, that is, the write data is unverified, retry processing is performed from S809 forward. First, in S809, the memory control circuit is set to the write mode again. Next, write data corresponding to the data unverified in the write control processing is written to an address of the first memory (S810). In the second write control processing during the retry processing, the data stored in the first memory is referred to as "recorrection data". The verification mode is set in S811, and recorrection data is read upon verification control processing in S812 and compared with corresponding write data. In S813, it is determined whether or not the write data matches with the recorrection data. If matched, an address for the next data to verify (verification data) is retrieved (S814). Then, write data corresponding to the verification data is stored in the second memory (S815), and the step S804 and subsequent steps are repeated. In S813, if the write data does not match with the recorrection data, retry processing is repeated plural times in S816. If the retry processing is normally completed before repeated a predetermined number of times, the procedure restarts with the step S809. If the data is unverified even after a predetermined number of retry processings are performed, the procedure is abnormally terminated.

Incidentally, another data rewriting technique is disclosed in Japanese Unexamined Patent Application Publication No. 2003-256266 (Maruyama et al.). According to the technique of Maruyama et al., at the time of writing data to a first memory, the data is written to a second memory and compared with data in the first memory, and then written to the first memory only if the comparison result is negative to thereby reduce unnecessary writing operations and save writing time. Further, the publication of Maruyama et al. describes a technique of comparing write data and read data divided into a predetermined size, and setting a mismatch flag if any of the divided data are not matched. Only the data with the mismatch flag is written to the first memory to reduce unnecessary writing operations.

However, the inventors of the subject application have found the following problems in the related art. In the verification processing of the related art, if verification ends in failure, retry processing for unverified data is immediately executed, and the procedure returns to verification processing after the retry processing. Upon the retry processing, the write processing and the verification processing are executed, so the memory control circuit should be switched between a write mode and a verification mode. Hence, each time data is unverified, the memory control circuit is switched between the write mode and the verification mode. A setup period for stabilizing a mode is necessary for switching the mode between a write mode and a verification mode. As a result, it is necessary to set aside some time for switching between a write mode and a verification mode each time data is unverified, so a data rewriting processing speed lowers. In particular, if plural data are unverified, a processing speed is remarkably lowered.

Further, although the technique of Maruyama et al. can reduce unnecessary writing operations by use of the mismatch flag, it is impossible to store data about which address in unit data obtained by dividing the original data into a predetermined size is mismatched. Thus, it is necessary to write the mismatched address to the first memory each time comparison is completed. That is, it is necessary to read data from the first memory and compare the read data with write data, and then write a mismatch flag to the first memory if the write data and the read data do not match. For example, in the case of writing a mismatched address to a storage element switchable between a writing operation and a reading operation such as a flash memory, a predetermined period is necessary for switching a mode for the writing operation or to generate an internal voltage. This leads to a problem that overhead time except actual write time is increased as the number of switching operations increases, and the whole write time is increased.

SUMMARY

A memory control circuit according to an aspect of the present invention includes: a writable/readable memory; a comparison unit comparing write data to write in the memory with read data that is read from a memory address where the write data is written; a comparison result storage unit storing a comparison result compared by the comparison unit in association with the memory address; and a control unit controlling retry processing of rewriting the write data to the memory address determined to be unverified based on the stored comparison result.

Further, a data rewriting method according to another aspect of the present invention includes: writing write data to a writable/readable memory; comparing the write data written to the memory with read data that is read from a memory address where the write data is written; storing a comparison result in association with the memory address; and controlling retry processing of rewriting the write data to the memory address determined to be unverified based on the stored comparison result.

As described above, unverified data are collectively subjected to retry processing, whereby in the retry processing, write processing of the unverified data is repeated, and then verification processing is carried out. Hence, a mode only needs to be switched to a write mode and a verification mode once. Thus, it is necessary to switch a mode for each unverified data unlike the related art. As a result, a data rewrite processing speed can be increased.

Owing to the above configuration, it is possible to provide a memory control circuit and a data rewriting method, which can reduce processing time for rewriting data stored in a storage element.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Components demonstrated in the following description and the accompanying drawings are omitted or simplified as appropriate, and repetitive description thereof is omitted if not necessary for clear explanation.

First Embodiment

Figure 1:
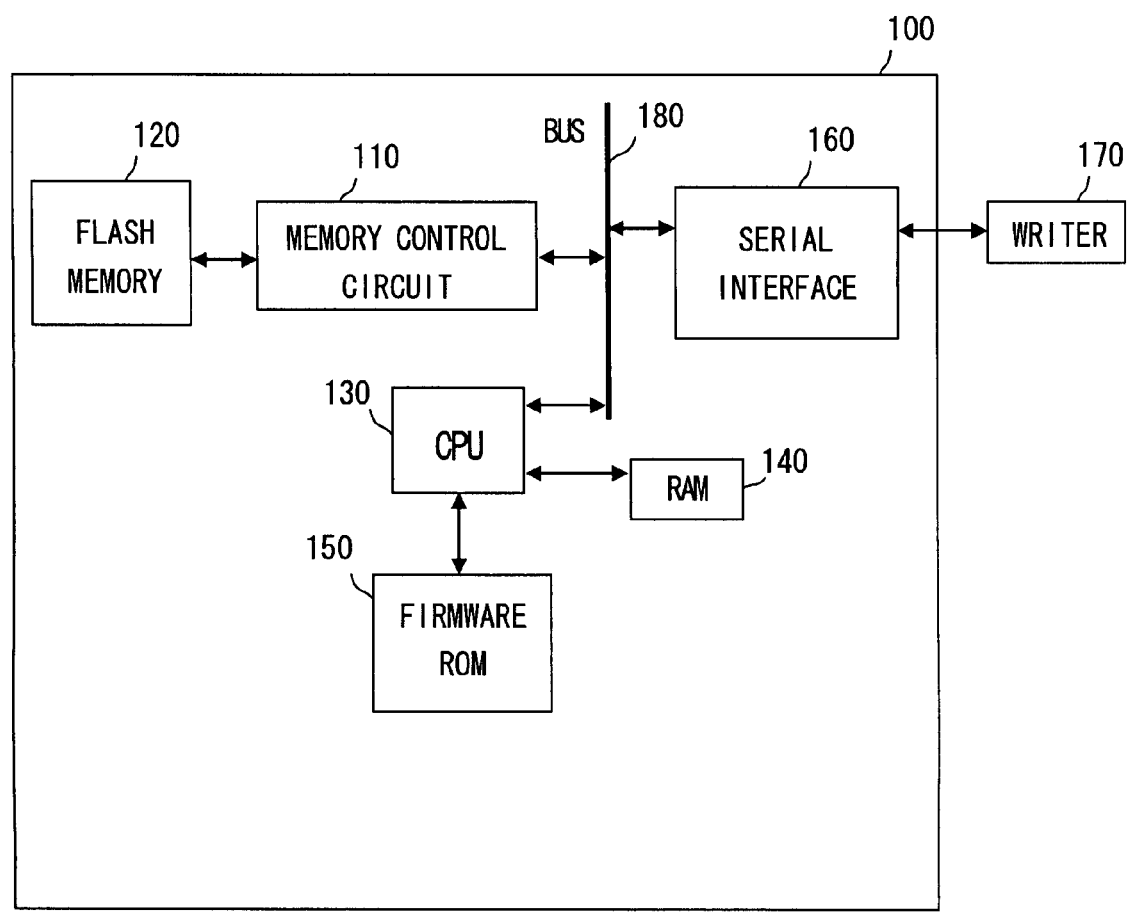
FIG. 1 is a block diagram of the configuration of a semiconductor device according to a first embodiment of the present invention.

Referring to the drawings, a memory control circuit according to a first embodiment of the present invention is described below. The first embodiment describes a memory control circuit for rewriting data to a flash memory incorporated in a semiconductor device packaged to LSI (Large Scale Integrated Circuit) by way of example. FIG. 1 is a block diagram of the configuration of a semiconductor device including the memory control circuit of the first embodiment.

As shown in FIG. 1, a semiconductor device 100 includes a memory control circuit 110, a flash memory 120, a CPU 130, a RAM (Random Access Memory) 140, a firmware ROM (Read Only Memory) 150, and a serial interface 160. An external writer 170 is used for writing a program or the like to the flash memory 120. The CPU 130 controls peripheral devices such as the memory control circuit 110 and the serial interface 160 through a bus 180. Each peripheral device is equipped with an input/output terminal and is connectable with an external device such as the bus 180 or the writer 170.

In the data rewriting processing of the first embodiment, the CPU 140 temporarily stores write data sent from the writer 170 in the RAM 140 through the serial interface 160. After storing a predetermined amount of write data in the RAM 140, the CPU 130 reads the data from the RAM 140 and transfers the data to the memory control circuit 110 through the bus 180. The operations of the CPU 130 are performed in accordance with a program written to the firmware ROM 150.

Figure 2:
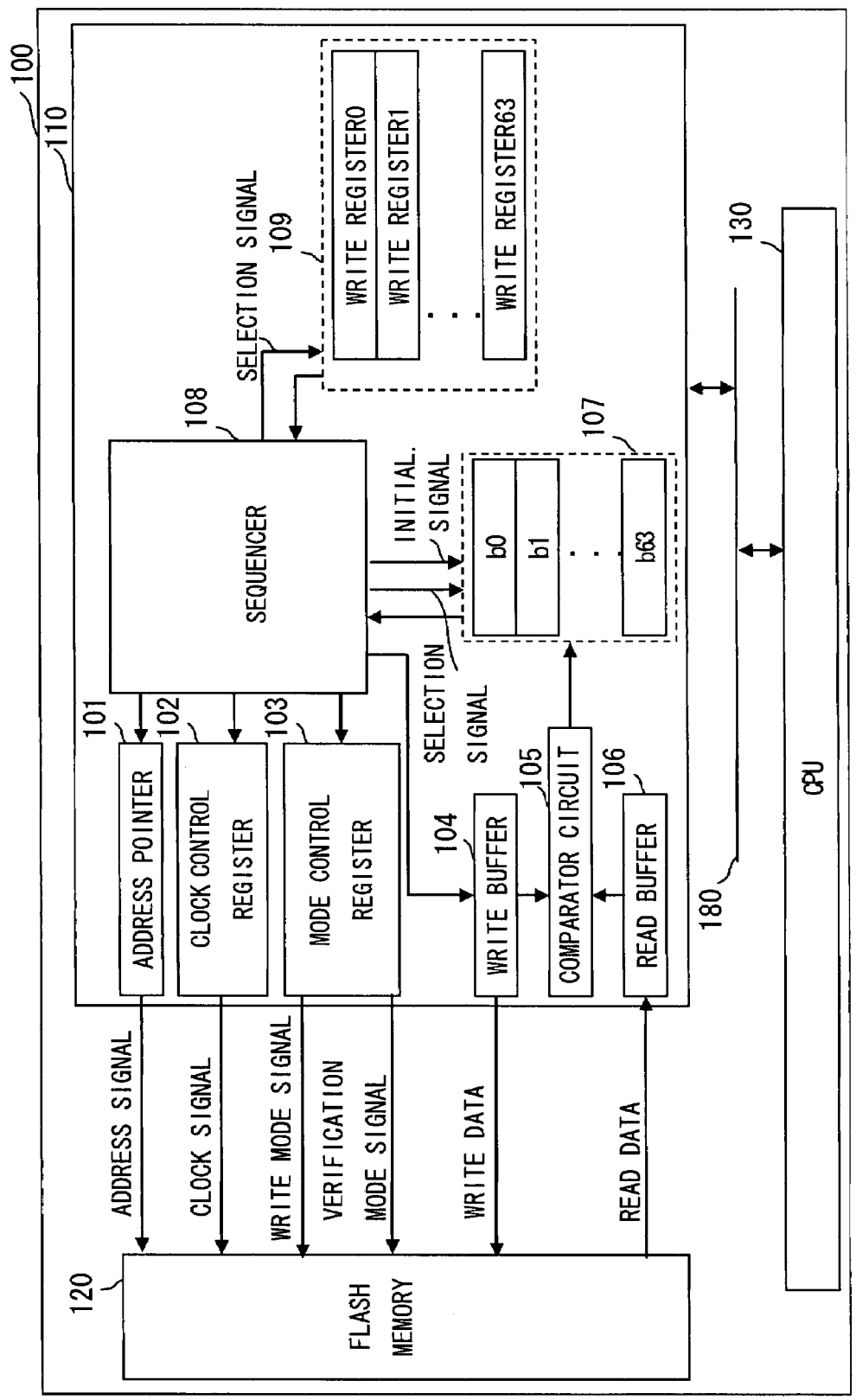
FIG. 2 is a block diagram of the configuration of a memory control circuit of the first embodiment.

Referring next to FIG. 2, the memory control circuit of the first embodiment is described. FIG. 2 is a block diagram of the configuration of the semiconductor device 100 for the data rewriting processing. The semiconductor device 100 includes a memory control circuit 110, a flash memory 120, and a CPU 130. The memory control circuit 110 includes an address pointer 101, a clock control register 102, a mode control register 103, a write buffer 104, a comparator circuit 105, a read buffer 106, a status register 107, a sequencer 108, and a write register 109. In the first embodiment, the storage element is the flash memory 120 but may be a nonvolatile storage element in place of the flash memory. The flash memory 120 has the same function as that of a first memory of the related art.

The memory control circuit 110 has a function to control write/read processing such as rewriting processing to the flash memory 120 in accordance with a request from the CPU 130. As for the write processing to the flash memory 120, data stored in the RAM 140 is read and transferred to the memory control circuit 110 by the CPU 130 as described above. The transferred write data is stored in the write register 109. The CPU 130 sets necessary information in the memory control circuit 110 and then requests the sequencer 108 to execute rewriting processing. Subsequent data rewriting processing is controlled by the sequencer 108.

Components of the memory control circuit 110 are described below. The address pointer 101 acquires a write address for writing data to the flash memory 120 in response to a command from the sequencer 108. Likewise, an address for reading data from the flash memory 120 is obtained. The clock control register 102 executes clock control over data rewriting processing in accordance with an instruction from the sequencer 108.

The mode control register 103 controls switching of a mode of the memory control circuit 110 in accordance with an instruction from the sequencer 108. In the memory control circuit 110, a write mode for write processing and a verification mode for verification processing are used and switched in accordance with processing. In the write mode, write processing for writing write data retrieved from the write register 109 by the sequencer 108 to the flash memory 120 is carried out. In the verification mode, verification processing for verifying whether or not data is correctly written to the flash memory 120 is executed. More specifically, the data written to the flash memory 12 is read to the read buffer 106 and compared with the original write data (expected value) set in the write buffer 104. That is, verification about whether or not an error occurs in the read data is referred to as "verification processing". Incidentally, in the following description, data to write in the flash memory 120 is referred to as "write data". Data obtained by reading the data written to the flash memory 120 for the verification processing is referred to as "read data".

The write buffer 104 is provided between the CPU 130 and the flash memory 120. The write buffer 104 is a temporary memory buffer for outputting write data to flash memory 120 during write processing and outputting verification data (write data) to the comparator circuit 105 during verification processing. Data is written to the write buffer 104 by the sequencer 108. In this embodiment, the write buffer 104 includes a 32-bit (4-byte) buffer area, for example. In the illustrated example, the write data sent from the CPU 130 is written in units of 32 bits. Incidentally, needless to say, the present invention is not limited to the 32-bit buffer area and the processing of writing data in units of 32 bits.

The read buffer 106 is provided between the CPU 130 and the flash memory 120. The read buffer 106 temporarily stores read data that is read from the flash memory 120 and outputs the data to the comparator circuit 105 upon verification processing. In the first embodiment, the read buffer 106 includes a 32-bit (4-byte) buffer area, for example. In the illustrated example, the read data is read in units of 32 bits. Incidentally, needless to say, the present invention is not limited to the 32-bit buffer area and the processing of reading data in units of 32 bits.

The comparator circuit 105 compares write data stored in the write buffer 104 with read data that is read from the read buffer 106 to verify whether or not the two are matched. The comparator circuit 105 compares data in the write buffer 104 with data in the read buffer 106 on the basis of unit area. For example, data is written in units of 32 bits, the comparator circuit 105 compares the write data with the read data every 32 bits. The comparator circuit 105 sends a comparison result to the status register 107. In this way, the comparator circuit 105 is a comparison unit for comparing write data written to the flash memory 120 with read data that is read from an address (memory address) of the flash memory 120 having the write data written thereto. If the 32-bit data stored in the write buffer 104 matches with the 32-bit data stored in the read buffer 106, the comparator circuit 105 outputs bit information "1" to the status register 107, for example. If the data stored in the write buffer 104 does not match the data stored in the read buffer 106, the comparator circuit 105 sends bit information "0" to the status register 107, for example. Incidentally, the output bit information may be "0" if the two are matched, or "1" if the two are not matched.

The status register 107 stores the comparison result from the comparator circuit 105. The status register 107 can store the comparison result regardless of whether or not the data are matched. The status register 107 of the first embodiment includes 64 1-bit flags. Hence, the status register 107 can store 64 comparison results. For example, data is written in units of 32 bits (4 bytes), the comparison results corresponding to 64×32 bits (256 bytes). That is, the status register 107 is a comparison result storage unit that includes a 10-bit information storage area for each write data (one write data) and stores a result of comparing the write data with read data. It is determined which bit value of the status register 107 is set for a comparison result, in accordance with a selection signal output from the sequencer 108 to the status register 107. For example, if the comparison result is negative, the sequencer 108 sets a bit indicating mismatch in the corresponding status register 107. Incidentally, the set bit of the status register 107 corresponds to the write register 109 having corresponding data stored therein.

In the status register 107, the comparison result corresponding to one writing operation is set as a 1-bit flag. The set flag corresponds to an address (memory address) of the flash memory 120 that stores the data used for comparison. For example, if the comparator circuit 105 compares write data with read data and the comparison result is negative, bit information "0" is stored in b0 of FIG. 2. Here, b0 corresponds to a predetermined address (memory address) of the flash memory 120, and the mismatched read data is stored at the memory address. That is, the status register 107 is a comparison result storage unit for storing a comparison result from the comparator circuit 105 in association with an address (memory address) of the flash memory 120 where the write data used for comparison is written. A bit of the status register 107 corresponding to an address of the flash memory 120 is selected under the control of the sequencer 108. Incidentally, needless to say, a storage area of the status register 107 is not limited to 64-bit flags. Further, a storage element such as a RAM can be used as the status register 107. Further, the bit information may be "0" if the data are matched or "1" if the data are not matched. The status register 107 initializes bit information to "1" or "0" in accordance with an initialization signal from the sequencer 108 prior to the verification processing, and "0" or "1" is stored only to mismatched bit.

The sequencer 108 is a control unit that controls components of the memory control circuit 110 and controls the write processing, the verification processing, and the retry processing of the first embodiment. More specifically, the sequencer 108 controls the following operations. That is, the CPU 130 sets write data transferred to the write register 109 to the write buffer 104. Then, the write data is written to the flash memory 120 (write processing). After that, it is checked whether or not the write data is correctly written. That is, the write data written to the flash memory 120 is read, and the read data is stored in the read buffer 106 and compared with the write data set in the write buffer 104 (verification processing). If the comparison result is negative in the verification processing, error information is stored in the status register 107. Then, data stored at an address corresponding to the error information are collected and subjected to write processing (retry processing) again. The sequencer 108 is a control unit that controls retry processing for writing write to the mismatched memory address again based on the comparison result in the verification processing. Incidentally, these processings can be executed not only with the sequencer 108 but also with software processing of the CPU 130.

The write register 109 is provided on the upstream side of the write buffer 104. The write register 109 has a storage capacity larger than that of the write buffer 104 and can store write data from the CPU 130. For example, if data rewriting processing requested by the CPU 130 is performed, the write register 109 can store all write data and keep the data until the completion of the rewriting processing. In the rewriting processing, if the data are mismatched, the original write data corresponding to the mismatched data can be sent from the write register 109 to the write buffer 104. The data stored in the write register 109 can be output to the write buffer 104 through the sequencer 108. A selection signal for selecting register information of the write register 109 to be output to the write buffer 104 is sent from the sequencer 108 to the register 109. As described above, a bit of the status register 107 corresponds to the write register 109 where corresponding data is stored. Further, a bit of the status register 107 corresponds to a memory address of the flash memory 120. That is, the write register 109 is a data storage unit for storing data corresponding to the memory address. Then, the write data corresponding to a mismatched memory address is output to the write buffer 104 through the sequencer 108. Incidentally, a writing operation to the write buffer 104 is controlled by the sequencer 108.

In the illustrated example, the write register 109 of the first embodiment includes 64 write registers capable of 32-bit (4-byte) data. Accordingly, the write register 109 can store write data corresponding to 256 bytes. Incidentally, needless to say, the number of registers in the write register 109 is not limited to 64.

Figure 3:
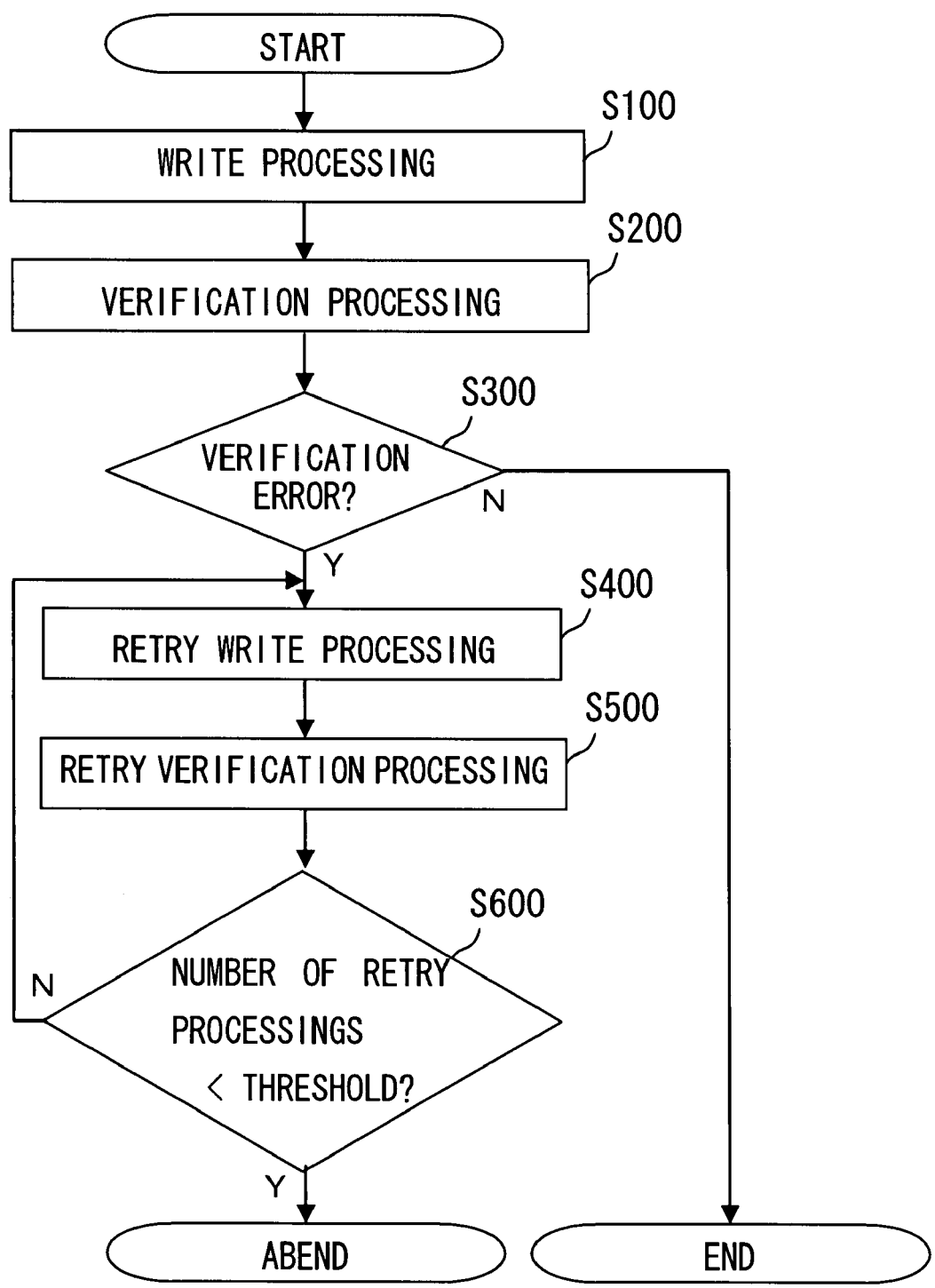
FIG. 3 is a flowchart of rewriting processing of the first embodiment.
Figure 9:
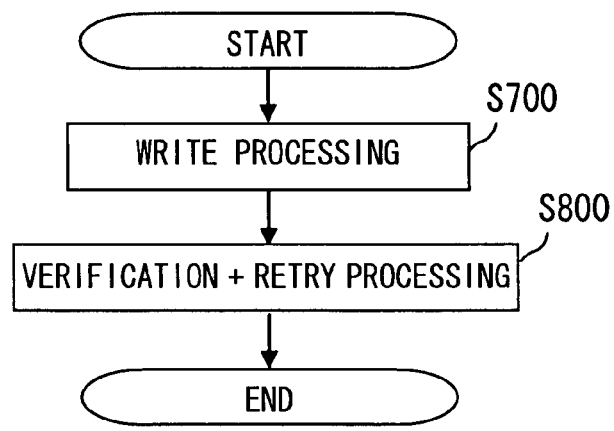
FIG. 9 is a flowchart of rewriting processing of the related art.

Referring next to FIG. 3, data rewriting processing of the first embodiment is described in detail. Incidentally, description is given with reference to FIG. 2 as needed. FIG. 3 is a flowchart of rewriting processing of the first embodiment. First, if the CPU 130 sends a request to rewrite data to the flash memory 120, write data is written to the flash memory 120 in the write processing (S100). The step S100 is similar to the step S700 of FIG. 9 illustrated in the description of related art. Incidentally, as a unit processing amount of the write data, an area designated as a write target may be all processed, or the designated area may be divided in predetermined units to process each divided area. Further, in the flash memory 120, one address corresponds to one writing operation.

Next, it is determined whether or not write data is correctly written in the verification processing (S200). Then, the data stored in the flash memory 120 is compared with the write data. In the verification processing, it is verified whether write data matches with read data that is read from the flash memory 120 based on the comparison result and the verification result is stored in the status register 107. In S300, if the write data is unverified, the unverified data is subjected to retry processing. If the write data is verified, the rewriting processing is completed.

The retry processing includes retry write processing (S400) and retry verification processing (S500). Upon retry write processing in S400, the data unverified in S300 is subjected to write processing again and stored in the flash memory 120. Data corrected again in the write processing is referred to as "recorrection data". During retry verification processing in S500, it is determined whether or not the recorrection data is correctly written to the flash memory 120. For that purpose, the recorrection data is compared with the original write data. In the retry verification processing, if write data does not match with recorrection data as a comparison result, retry processing is repeated a predetermined number of times. If the data is unverified even if the retry verification processing is repeated a predetermined number of times, the processing is abnormally terminated.

Figure 4:
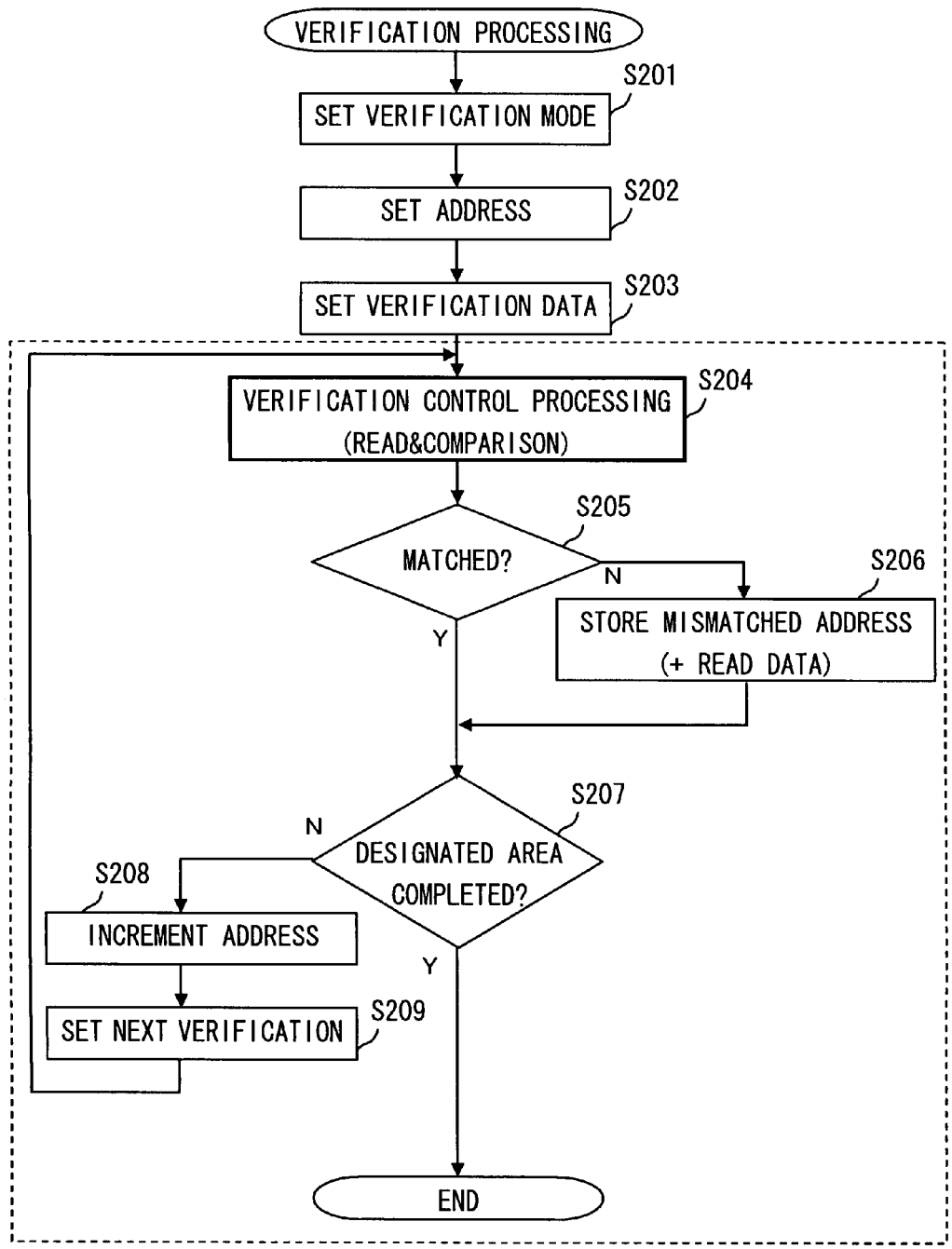
FIG. 4 is a detailed flowchart of verification processing of the first embodiment.
Figure 10:
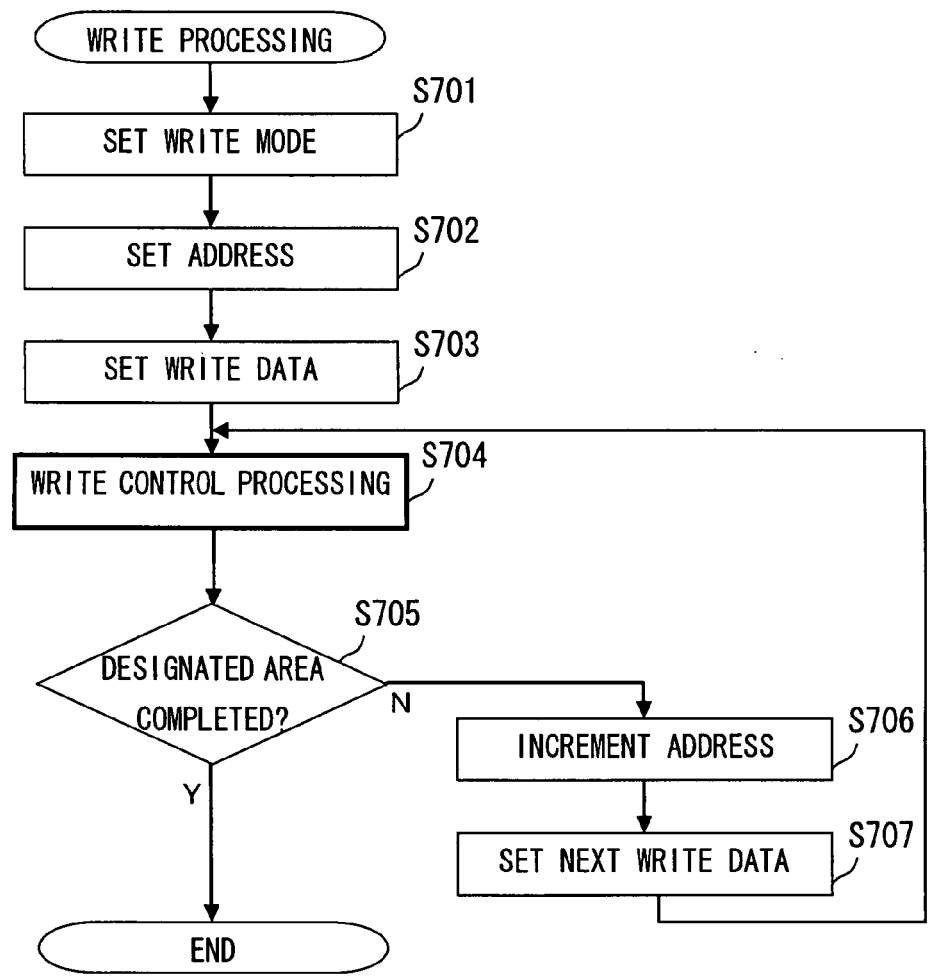
FIG. 10 is a detailed flowchart of write processing of the related art.
Figure 11:
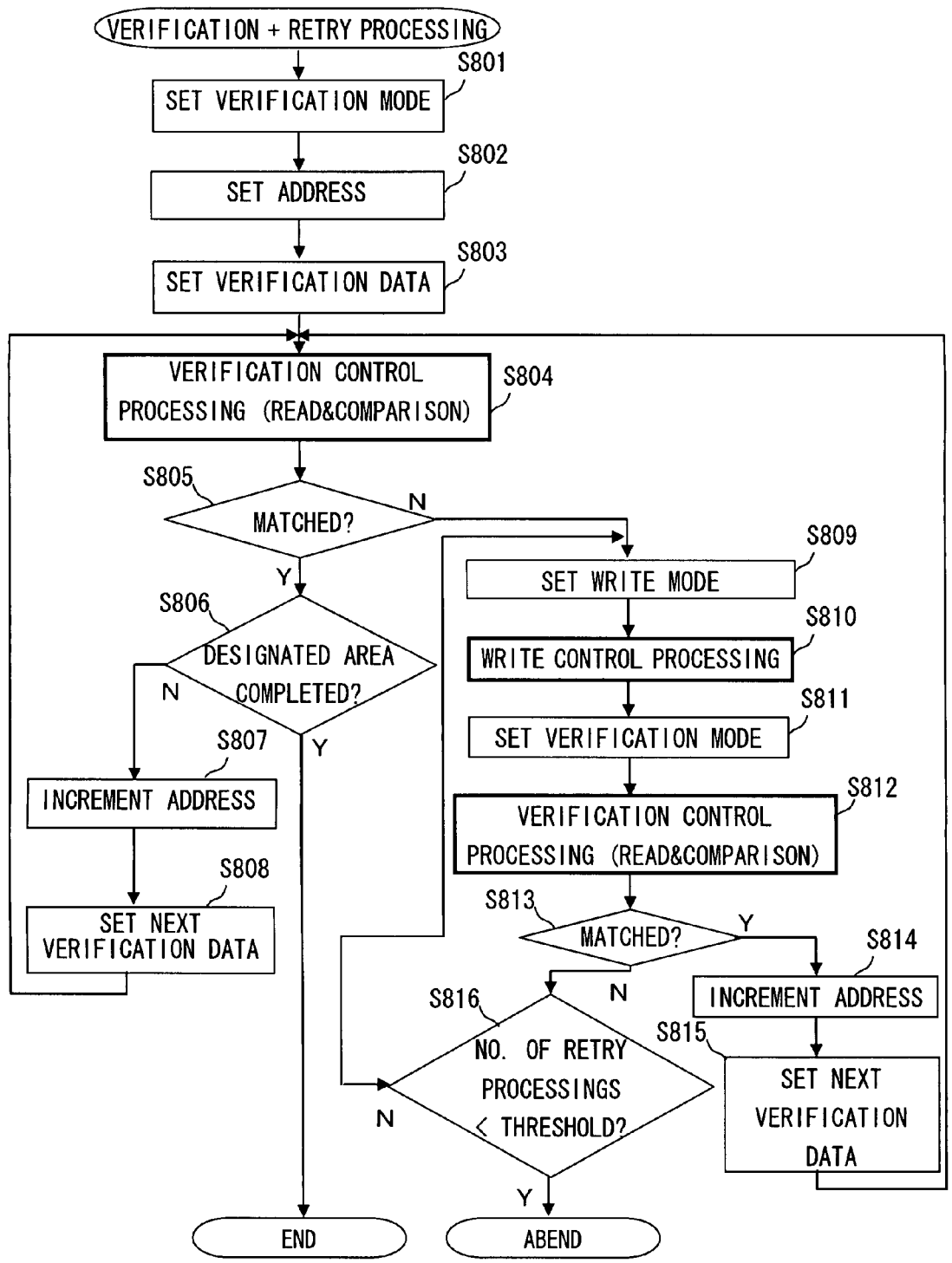
FIG. 11 is a detailed flowchart of verification processing+ retry processing of the related art.

The processing of FIG. 3 is described below in more detail. A flow of the write processing in S100 is the same as a flow of FIG. 10, so its description is omitted here. FIG. 4 is a detailed flowchart of a verification processing (S200) of FIG. 3. Referring to FIG. 4, operations of the verification processing (S200) of the first embodiment are described.

In the verification processing (S200), it is checked whether or not data is correctly written to the flash memory 120 in the write processing (S100). First, the memory control circuit 110 sets the mode control register 103 to a verification mode in response to a request of the sequencer 108 (S201). Next, the address pointer 101 acquires address information of data stored in the flash memory 120 (S202).

Next, the write buffer 104 stores write data corresponding to the data stored at the address acquired in S202 (S203). The original write data used in the write processing (S100) is held in the write register 109 until the completion of the rewriting processing. Hence, the write data held in the write register 109 is restored in the write buffer 104. Here, as a unit processing amount of the write data, an area designated as a write target may be all processed, or the designated area may be divided in predetermined units to process each divided area. Next, in verification control processing of S204, data stores at the address acquired in S202 is read to the read buffer 106 (read data). Then, it is verified whether or not the read data matches the write data stored in the write buffer 104.

In S205, it is determined whether or not write data in the write buffer 104 matches with read data in the read buffer 106. If matched, bit information (for example, "1") indicating that the two are matched is stored in the status register 107 corresponding to the address where the read data is stored. Next, it is determined whether or not write data in the designated area are all verified in the write processing (S100) (S207). If not all verified, verification processing is executed for the next read data. That is, an address of the next data to verify is set in the address pointer 101 (S208). Then, write data corresponding to the data is stored in the write buffer 104 (S209), and the step S204 and subsequent steps are repeated.

In S205, if the write data does not match with read data, that is, the write data is unverified, bit information (for example, "0") indicating that the two are mismatched is stored in the status register 107 corresponding to the address where the unverified data is stored (S206). Then, the step S207 and subsequent steps are performed.

The verification processing of this embodiment has a feature that a procedure of comparing write data divided in unit amounts with read data and storing the comparison result in the status register 107 is repeated until all write data in the designated area are compared. That is, in the verification processing of this embodiment, even if unverified data is found, retry processing is not immediately performed unlike the related art; after all write data in the designated area are subjected to verification processing, retry processing is performed. The memory control circuit 110 of this embodiment includes a status register 107 where verification results are collectively stored. Incidentally, the verification processing of this embodiment is controlled by the sequencer 108. However, the step S204 and subsequent steps surrounded by the dotted line may be controlled not only with the sequencer 108 but also with the CPU 130.

Figure 5:
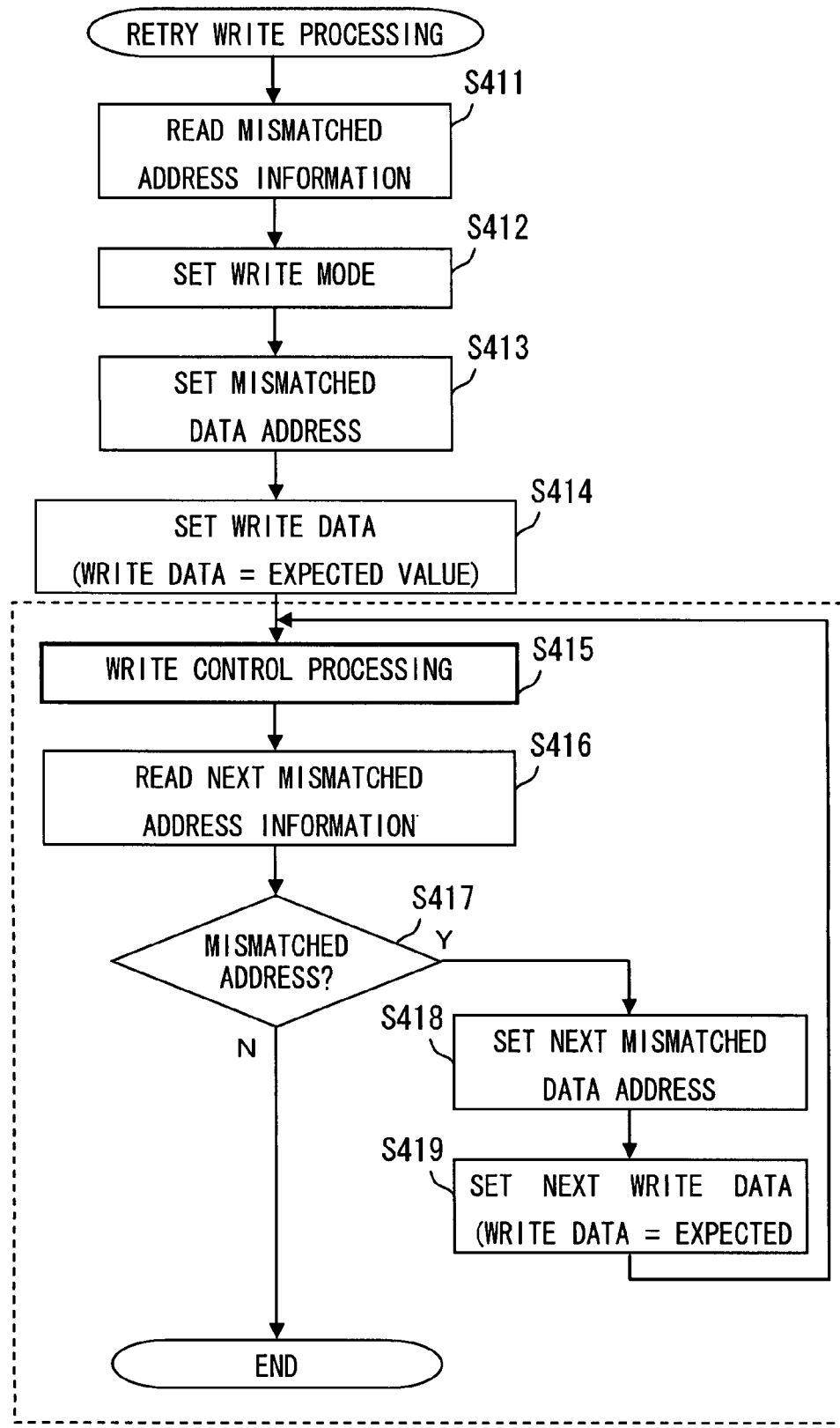
FIG. 5 is a detailed flowchart of retry write processing of the first embodiment.

Referring next to FIG. 5, operations of the retry write processing of the first embodiment (S400) are described. FIG. 5 is a detailed flowchart of the retry write processing (S400) of FIG. 3.

The retry write processing (S400) is processing of writing the original write data corresponding to the data unverified in the verification processing (S200) again to the flash memory 120. First, the sequencer 108 reads address information about the data unverified in the verification processing (S200) from the status register 107 (S411). Further, the memory control circuit 110 sets a write mode to the mode control register 103 in response to a request of the sequencer 108 (S412).

Next, address information about the unverified data read from the status register 107 is acquired by the address pointer 101 (S413). Next, write data corresponding to the acquired address information is stored in the write buffer 104 (S414). The write data is the original data transferred from the CPU 130, in other words, an expected value to be stored in the flash memory 120. The original write data used in the write processing (S100) or verification processing (S200) is held in the write register 109 until the completion of the rewriting processing. Hence, the write data stored in the write register 109 is restored in the write buffer 104 through the sequencer 108. Next, in S415, write data stored in the write buffer 104 is stored to the address of the flash memory 120 acquired in S413, and the write control processing is performed. In the retry write processing, data stored in the flash memory 120 is referred to as recorrection data.

Next, in S416, address information about the other unverified data stored in the status register 107 is read. In S417, it is determined whether or not there is address information about the unverified data. If there is no address information, the retry write processing is completed. In S417, if there is address information about the unverified data, an address of the next unverified data is set in the address pointer 101 (S418). Then, the original write data (expected value) corresponding to the address is stored in the write buffer 104 (S419), and the step S415 and subsequent steps are repeated.

A feature of the retry write processing of this embodiment is that as many writing operations as the number of unverified data are sequentially repeated. Thus, in the retry write processing of this embodiment, it is unnecessary to switch a mode between retry write processing and retry verification processing for each unverified data unlike the related art. Incidentally, the retry write processing of this embodiment is controlled by the sequencer 108. However, the step S415 and subsequent steps surrounded by the dotted line can be controlled not only with the sequencer 108 but also with the CPU.

Figure 6:
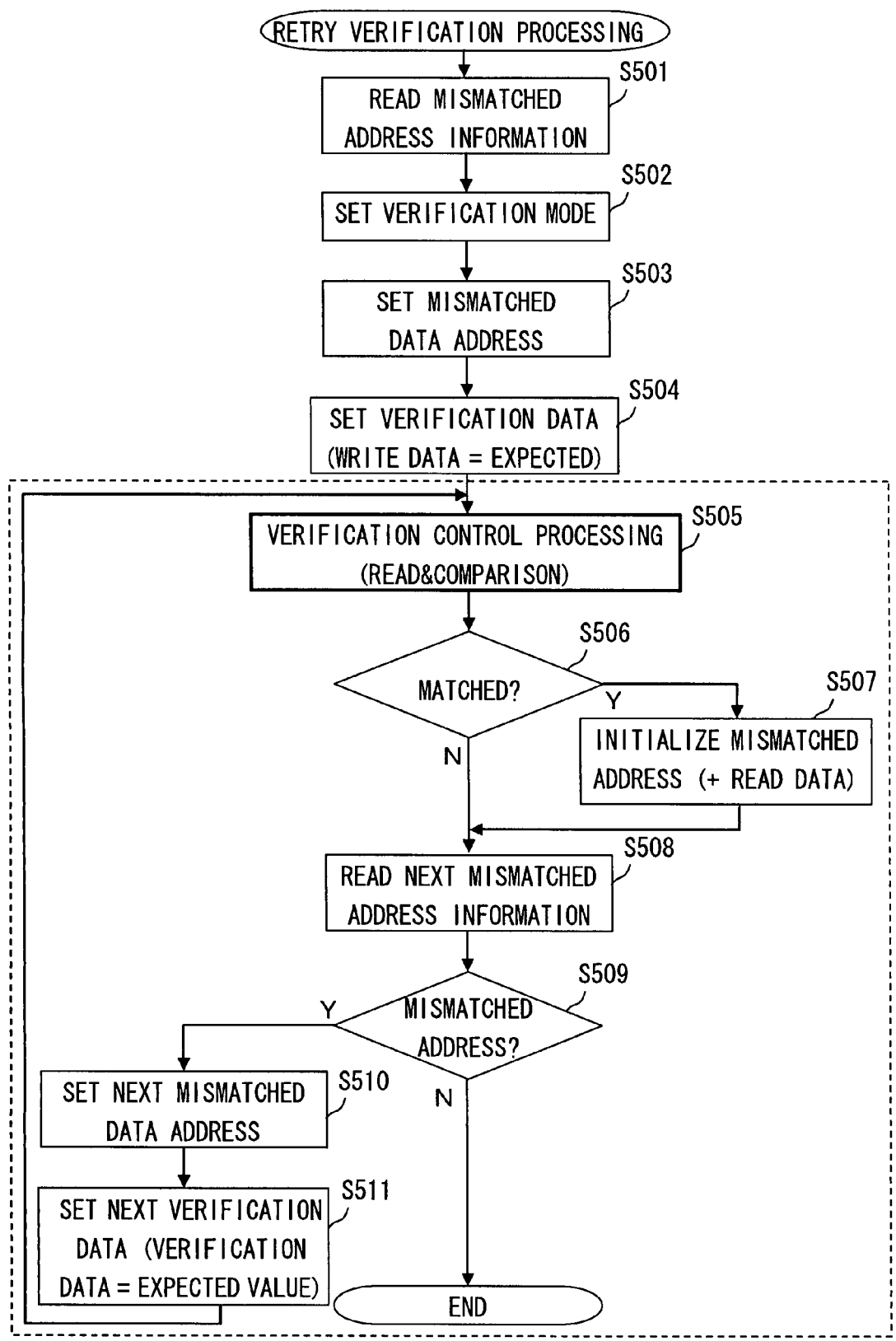
FIG. 6 is a detailed flowchart of retry verification processing of the first embodiment.

Referring next to FIG. 6, operations of the retry verification processing (S500) of the first embodiment are described. FIG. 6 is a detailed flowchart of the retry verification processing (S500) of FIG. 3.

In the retry verification processing (S500), it is verified whether or not recorrection data stored in the flash memory 120 in the retry write processing (S400) is correctly stored. First, the sequencer 108 reads address information about the unverified data from the status register 107 in the verification processing (S200) (S501). Incidentally, recorrection data written in the retry write processing is stored to the read address. Further, the memory control circuit 110 sets the mode control register 103 to a verification mode in response to a request of the sequencer 108 (S502).

Next, address information about unverified data read from the status register 107 is retrieved from the address pointer 101 (S503). Next, write data corresponding to acquired address information is stored in the write buffer 104 (S504). The write data is the original data transferred from the CPU 130 (write data), in other words, an expected value to be stored in the flash memory 120. The original write data used in the write processing (S100) or verification processing (S200) is held in the write register 109 until the completion of the rewriting processing. Accordingly, the write data held in the write register 109 is restored in the write buffer 104 through the sequencer 108. In the verification control processing of S505, the recorrection data stored at the address retrieved in S503 is read to the read buffer 106. Then, it is verified whether or not the recorrection data matches with write data stored in the write buffer 104.

In S506, it is determined whether or not the write data in the write buffer 104 matches with recorrection data in the read buffer 106. If matched, bit information corresponding to an address of the unverified data in the status register 107 is initialized by the sequencer 108 (S507). The bit information in the status register 107 are all initialized to "1" or "0" in accordance with an initialization signal from the sequencer 108 prior to the verification processing, and "0" or "1" is stored only to mismatched bit. Hence, if bit information of the status register 107 corresponding to an address where unverified data is stored is "0", "1" is stored through initialization. Incidentally, in the case where bit information of the status register 107 is "1" if the data is unverified, "0" can be stored through initialization. If not matched, address information about the next unverified data stored in the status register 107 is read (S508).

In S509, it is determined whether or not there is address information about the unverified data. If there is no address information, the retry verification processing is terminated. If there is address information about the unverified data, the address pointer 101 acquires address information for the next unverified data (S510). Then, write data corresponding to the address is sent from the write register 109 to the write buffer 104 (S511), the step S505 and subsequent steps are repeated.

A feature of the retry verification processing of the first embodiment that verification processing of recorrection data written during retry write processing is repeated as many times as the number of recorrection data. Thus, in the retry verification processing of this embodiment, it is unnecessary to switch a mode between retry write processing and retry verification processing for each unverified data unlike the related art. Incidentally, the retry verification processing of this embodiment is controlled by the sequencer 108. However, the step S505 and subsequent steps surrounded by the dotted line can be controlled not only with the sequencer 108 but also with the CPU 130.

As described above, the memory control circuit of the first embodiment includes the status register 107 that collective stores data unverified in the verification processing (S200). Then, in the retry processing, write processing of unverified data stored in the status register 107 is repeated, and verification processing of recorrection data is repeated. Thus, a memory circuit of this embodiment does not need to suspend verification processing each time unverified data is found in the verification processing and execute retry processing every unverified data unlike the related art. As a result, it is unnecessary to switch a mode between a write mode and a verification mode each time the unverified data is found.

For example, processing time of this embodiment is represented by Expression 1, and processing time of the related art is represented by Expression 2. D represents the number of data obtained by dividing data written to a designated area in predetermined units, and N represents the number of addresses of unverified data.

processing time=D×verification processing time+N× write processing time+mode switching time   (Expression 1)

Processing time=D×verification processing time+N× (write processing time+2×mode change time)   (Expression 2)

If Expressions 1 and 2 are compared, the processing time (Expression 1) of the first embodiment does not involve processing time for switching between two modes every unverified data as compared with the processing time (Expression 2) of the related art. That is, it is possible to cut a period necessary for switching a mode between a write mode and a verification mode every unverified data. As a result, an effect of increasing a data rewriting processing speed is attained.

Such configuration is particularly effective for executing write processing based on retry processing such as multistate write processing or for the case where write data is divided, and plural data is unverified.

Further, unverified data is stored in the status register 107 corresponding to a memory address to thereby easily detect an address where the unverified data is stored. That is, it is unnecessary to set a mismatch flag to a storage element that requires much time to switch a mode between a write mode and a read mode unlike the technique of Maruyama et al., and an effect of increasing a processing speed of data rewriting processing is attained.

Second Embodiment

Figure 7:
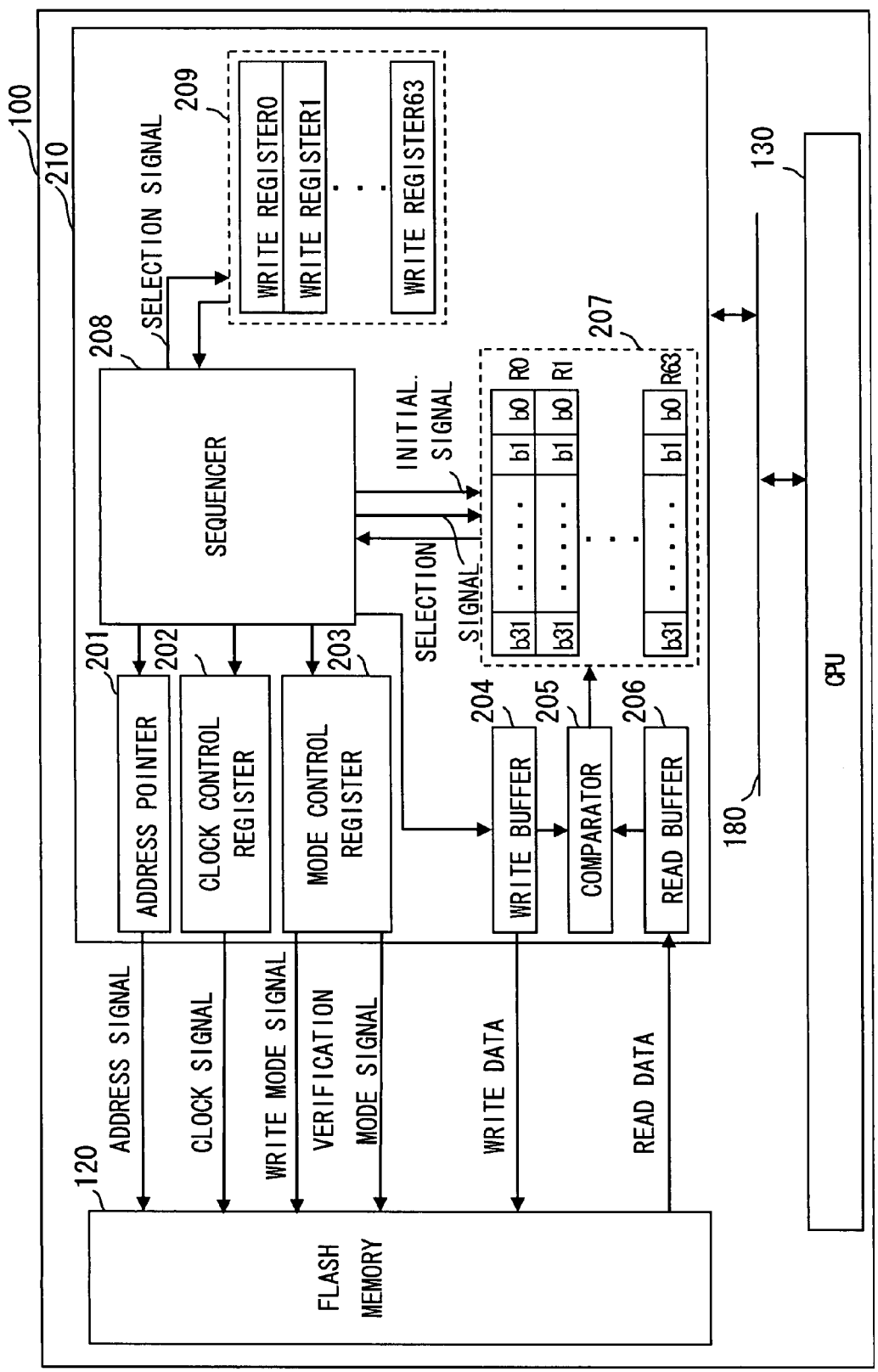
FIG. 7 is a block diagram of the configuration of a memory control circuit according to a second embodiment of the present invention.

Next, a second embodiment of the present invention is described. The second embodiment describes a memory control circuit executing rewriting processing to a flash memory incorporated into a semiconductor device packaged to an LSI or the like similar to the first embodiment. Description of the same components and operations of the semiconductor device as those of the first embodiment is omitted here. Referring to FIG. 7, a memory control circuit of the second embodiment is described. FIG. 7 is a block diagram of a semiconductor device including the memory control circuit of the second embodiment.

FIG. 7 is a block diagram of the configuration for controlling data rewriting processing in the semiconductor device 200. The configuration and function of the memory control circuit 210 of the second embodiment are similar to the memory control circuit of the first embodiment 110 of FIG. 2 except the comparator circuit 205 and the status register 207. Further, the configuration between the memory control circuit 210 and the flash memory 120, and the CPU 130 is similar to that of the first embodiment, so its description is omitted here.

The status register 207 is a register storing a comparison result from the comparator circuit 205 similar to the first embodiment. The status register 207 of the second embodiment can store the comparison result regardless of whether or not the comparison result is positive. Further, the status register 207 of the second embodiment includes 64 registers. Then, a comparison result of data corresponding to one writing operation is set in 1 register. The register corresponds to an address of the flash memory 120 storing data used for comparison.

A feature of the second embodiment is that 64 registers store a comparison result from the comparator circuit 205 and include a predetermined data area. In the second embodiment, registers of the status register 207 are b0 to b31, 32 bits in total, in accordance with 32-bit data corresponding to one writing or reading operation. In the comparator circuit 205, bits of the write buffer 204 are compared with bits of the read buffer 206 similar to the first embodiment. In the first embodiment, a result of determining whether or not all of 32 bits are matched is output to the status register 207. In contrast, in the second embodiment, information about whether or not each bit is matched is output. For example, 32-bit information is output to the status register 207 with "1" set as a matched bit or "0" set as a mismatched bit. Further, needless to say, a storage area of the status register 207 is not limited to 64 registers and data stored in 1 register is not limited to 32-bit data. Data stored in 1 register can be changed in accordance with a unit writing amount. Further, a storage element such as a RAM can be used for the status register 207. Further, if a comparison result from the comparator circuit 205 is negative, information in the status register 207 may be "1", not "0". The status register 207 initializes bit information to "1" or "0" in accordance with an initialization signal from the sequencer 108 prior to the verification processing, and "0" or "1" is stored only to mismatched bit.

For example, the comparator circuit 205 compares 32-bit write data with 32-bit read data. Only the least significant bit is mismatched, "0" is stored as b0 of the register R0 of the status register 207. At the same time, "1" indicating that the bit is matched is stored to the other bits b1 to b31 of the register R0. As for the registers R1 to R63 as well, a bit mismatched as a result of comparison is only set to "0". A comparison operation of the comparator circuit 205 can be executed through ENOR (exclusive NOR) between the write data and the read data. As a result, if "0" is stored in the status register 207, information that a mismatched bit is found in a data area of the flash memory 120 corresponding to the register and mismatched bit positional information can be obtained.

After that, data is rewritten to the mismatched address of the flash memory 120 through retry processing. In this case, write processing is performed such that data to be written to only a mismatched bit is used as write data based on bit information of the status register 207. For example, after the initial write data is written, the obtained read data is compared with the write data. As a result, the data is written again to a mismatched memory address. In this case, unnecessary overwriting to the normally written bit is not performed based on the bit information in the status register 207. On the other hand, write processing is formed on only the bit that is not normally written. In the flash memory 120, unnecessary writing is not performed, making it possible to prevent an intended stress from being applied to a memory cell (memory bit). In this case, it is possible to use information in the status register 207 after the comparison as rewrite data in such memory configuration that "0" is written to a memory cell during actual writing operations. Prior to the verification processing, bit information in status register 207 are all set to "1" in accordance with an initialization signal from the sequencer 108, and "0" may be stored to only a mismatched bit. Further, in the above description, data to be written to only a mismatched bit is used as write data for write processing, but the same data as the initial write data including a matched bit may be written. Further, whether actual write data to be written to a memory cell is "0" or "1" can be determined as appropriate at the stage of circuit design. Further, mismatched information stored in the status register 207 may be "1", or bit information may be initialized to "0" prior to verification.

As described above, the registers R0 to R63 correspond to a predetermined address of the flash memory 120 and store data verified/unverified in the verification processing. That is, the status register 207 includes an information storage area of plural bits for each write data (one write data). The information storage area of the status register 207 is a comparison result storage unit storing a comparison result of each bit of the write data (corresponding to each bit).

Next, data rewriting processing of the second embodiment is described. The data rewriting processing of the second embodiment is the same as that of the first embodiment except for a part of the verification processing in S200 of the flowchart of FIG. 3 and retry processing in S400 and S500. In the following description, only the verification processing and retry processing specific to the second embodiment are described, the other processing is the same as that of the first embodiment, so its description is omitted here.

The verification processing of the second embodiment is described with reference to a flowchart of FIG. 4. In the verification control processing in S204 of FIG. 4, data is compared for each writing operation and in addition, comparison is performed to verify whether or not 32-bit write data matches with 32-bit read data. Accordingly, in the step S206, the status register 207 stores a result of comparing 32-bit write data with 32-bit read on the bit basis (hereinafter referred to as read result). The other processing is similar to that of the first embodiment, and its description is omitted here.

Figure 8:
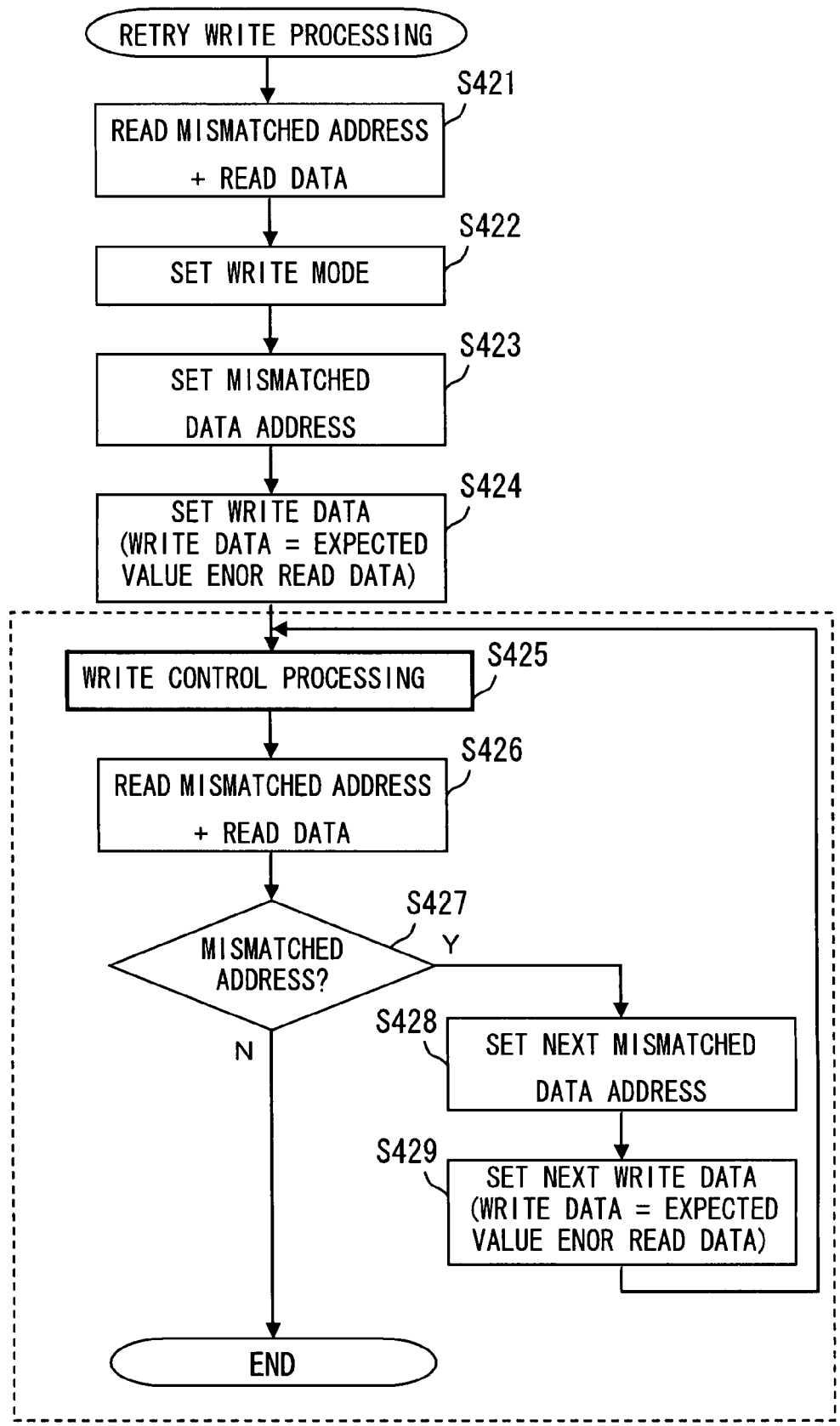
FIG. 8 is a detailed flowchart of retry write processing of the second embodiment.

Referring next to FIG. 8, retry write processing of the second embodiment is described. The retry write processing of this embodiment is processing of writing data unverified in verification processing again to the flash memory 120. First, the sequencer 208 reads address information about data unverified in the verification processing, and a result of reading the data from the status register 207 (S421). Further, the memory control circuit 210 sets the mode control register 203 to a write mode in response to a request from the sequencer 108 (S422).

Next, address information about an unverified bit read from the status register 207 is acquired by the address pointer 201 (S423). In S424, write data corresponding to the acquired address is stored in the write buffer 204. The write data processed in S424 is write data corresponding to a bit that is mismatched through exclusive NOR between the original write data transferred from the CPU 130 (expected value) and read data. Then, write control processing is performed only on a bit that is determined to be mismatched based on a comparison result which is stored in the write buffer 204 (S425).

In S426, address information about the next unverified data stored in the status register 207 and a result of reading the data are retrieved. In S427, it is determined whether or not there is address information about verified data. If there is no address information, the retry write processing is terminated. In S427, if there is address information about unverified data, the address is obtained by the address pointer 201 (S428). Then, write data corresponding to the obtained address is stored in the write buffer 204 (S429), and the step S425 and subsequent steps are repeated. Incidentally, write data processed in S429 is similar to that of S424. That is, the write data of S429 is write data corresponding to a bit that is mismatched through exclusive NOR between the original write data transferred from the CPU 130 (expected value) and read data.

The retry write processing of the second embodiment is controlled by the sequencer 208. However, the step S425 and subsequent steps may be controlled not only with the sequencer 208 but also with the CPU 130. Further, the sequencer 208 may be a CPU other than the CPU 130.

Next, the retry verification processing of the second embodiment is described. The flow of the retry verification processing of this embodiment is the same as that of the flowchart of FIG. 6. Here, in the step S507, the status register 207 stores read data as well as a result of comparing bits for each writing operation.

As described above, the read data is stored in the status register 207 to thereby narrow down an unverified data area. As a result, it is possible to reduce write processing time without performing write processing on an area where retry is unnecessary.

Further, data is written to only unverified bits to thereby prevent a stress from being applied to a memory cell due to unnecessary writing operation.

Incidentally, the semiconductor device is desirably a single-chip microcomputer with a built-in flash, but the present invention is not limited thereto.

It is apparent that the present invention is not limited to the above embodiment but may be modified and changed without departing from the scope and spirit of the invention.

What is claimed is:

1. A memory control circuit, comprising:
   a writable/readable memory;
   a comparison unit comparing write data to write in the memory with read data that is read from a memory address where the write data is written;
   a comparison result storage unit storing a plurality of comparison results, each comparison result compared by the comparison unit in association with a respective memory address; and
   a control unit controlling retry processing of rewriting respective write data to the memory addresses determined to be unverified based on the stored comparison results, wherein the control unit controls the retry processing to begin only after the comparison result storage unit is controlled to store all of the plurality of comparison results, even if at least one of the memory addresses is determined to be unverified.

2. The memory control circuit according to claim 1, wherein the control unit successively performs the retry processing to memory addresses determined to be unverified.

3. The memory control circuit according to claim 1, further comprising:
   a data storage unit storing the write data,
   wherein the data storage unit sends write data corresponding to the respective memory addresses determined to be unverified to the control unit.

4. The memory control circuit according to claim 2, further comprising:
   a data storage unit storing the write data,
   wherein the data storage unit sends write data corresponding to the respective memory addresses determined to be unverified to the control unit.

5. The memory control circuit according to claim 1, wherein the comparison result storage unit includes 1-bit information storage area for each write data, and stores results of comparing the write data with read data in respective of the storage areas.

6. The memory control circuit according to claim 1, wherein the comparison result storage unit includes an information storage area of a plurality of bits for each write data, and stores a result of comparing each bit of the write data with each bit of read data.

7. The memory control circuit according to claim 1, wherein the memory is a nonvolatile memory.

8. A microcomputer equipped with the memory control circuit according to claim 1.

9. A data rewriting method, comprising:
writing write data to a writable/readable memory;
comparing the write data written to the memory with read data that is read from a memory address where the write data is written;
storing a plurality of comparison results, each comparison result in association with a respective memory address; and
controlling retry processing of rewriting respective write data to the memory addresses determined to be unverified based on the stored comparison results, wherein the retry processing is controlled to begin only after all of the plurality of comparison results are stored, even if at least one of the memory addresses is determined to be unverified.

10. The data rewriting method according to claim 9, wherein the controlling of the retry processing includes successively performing the retry processing to memory addresses determined to be unverified.

11. The data rewriting method according to claim 9, further comprising:
storing the write data; and
sending write data corresponding to the respective memory addresses determined to be unverified to the control unit.

12. The data rewriting method according to claim 10, further comprising:
storing the write data; and
sending write data corresponding to the respective memory addresses determined to be unverified to the control unit.

13. The data rewriting method according to claim 9, wherein the storing the comparison results stores a 1-bit comparison result for each write data.

14. The data rewriting method according to claim 9, wherein the storing the comparison results stores a comparison result of the write data and information about a result of comparing each bit of the write data with each bit of read data for each write data.

15. The memory control circuit according to claim 1, wherein the retry processing comprises retry write processing and retry verification processing.

16. The memory control circuit according to claim 15, wherein the control unit successively performs the retry write processing to all memory addresses determined to be unverified without any intervening retry verification processing to all memory addresses determined to be unverified.

17. The memory control circuit according to claim 15, wherein the control unit successively performs the retry verification processing to all memory addresses determined to be unverified without any intervening write processing to all memory addresses determined to be unverified.

18. The data writing method according to claim 9, wherein the retry processing comprises retry write processing and retry verification processing.

19. The data writing method according to claim 18, wherein the retry write processing is performed to all memory addresses determined to be unverified without any intervening retry verification processing to all memory addresses determined to be unverified.

20. The data writing method according to claim 18, wherein the retry verification processing is performed to all memory addresses determined to be unverified without any intervening write processing to all memory addresses determined to be unverified.

* * * * *